(12) United States Patent
Mori et al.

(10) Patent No.: US 7,243,834 B2
(45) Date of Patent: Jul. 17, 2007

(54) METAL MASK AND METHOD OF PRINTING LEAD-FREE SOLDER PASTE USING SAME

(75) Inventors: Takayuki Mori, Shiga (JP); Shuichi Komamizu, Kyotanabe (JP); Kazumi Makino, Shimonoseki (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 97 days.

(21) Appl. No.: 10/803,884

(22) Filed: Mar. 19, 2004

(65) Prior Publication Data
US 2004/0188502 A1 Sep. 30, 2004

(30) Foreign Application Priority Data
Mar. 31, 2003 (JP) ............................. 2003-093363

(51) Int. Cl.
*B23K 31/00* (2006.01)
(52) U.S. Cl. ..................................... 228/248.1; 228/22
(58) Field of Classification Search ............. 228/248.1, 228/22; 101/127; 118/213, 406
See application file for complete search history.

(56) References Cited

U.S. PATENT DOCUMENTS

| 5,593,080 A | 1/1997 | Teshima et al. ............. 228/39 |
| 5,740,730 A * | 4/1998 | Thompson, Sr. ............ 101/127 |
| 5,868,070 A | 2/1999 | Barlow ...................... 101/123 |

FOREIGN PATENT DOCUMENTS

| DE | 10055101 | * | 5/2002 |
| JP | 63-115169 | | 5/1988 |
| JP | 2-81689 | | 3/1990 |
| JP | 4-57390 | | 2/1992 |
| JP | 8-230346 | | 10/1996 |
| JP | 2001-39048 | | 2/2001 |
| JP | WO 02/40213 | | 5/2002 |
| JP | 2002-362003 | | 12/2002 |
| JP | 2003-8193 | | 1/2003 |
| JP | 2003-10996 | | 1/2003 |

OTHER PUBLICATIONS

Shiro, Translation to JP 8-230346; Oct. 9, 1996; pp. 1-3.*
European Patent Office Communication for corresponding European Patent Application No. 04006594 dated Jul. 23, 2004.

* cited by examiner

*Primary Examiner*—Jonathan Johnson
(74) *Attorney, Agent, or Firm*—Armstrong, Kratz, Quintos, Hanson & Brooks, LLP

(57) ABSTRACT

A lead-free solder paste printing method is practiced with use of a metal mask of the invention by placing the metal mask 1 on a circuit board 2 having an electrode 21 formed in a predetermined pattern to join an end portion of a lead member 6, and moving a printing squeegee along the upper surface of the metal mask 1 to thereby print a lead-free solder paste on the surface of the electrode 21 on the circuit board 2. The method produces on the electrode 21 of the circuit board 2 two lead-free solder paste patterns 30*a*, 30*a* each circular or elliptical in shape and arranged in a direction in which the lead member 6 is to extend from the electrode.

7 Claims, 5 Drawing Sheets

(a)

(b)

(c)

(d)

METAL MASK AND METHOD OF PRINTING LEAD-FREE SOLDER PASTE USING SAME

FIELD OF THE INVENTION

The present invention relates to metal masks and a method of printing a lead-free solder paste with use of the mask.

BACKGROUND OF THE INVENTION

FIG. 6 shows a known reflow soldering method of joining electronic parts, lead members or the like to a circuit board using a conventional tin-lead solder paste (see, for example, JP-A No. 2002-362003).

First, a metal mask 1 is prepared which has openings 11 at portions thereof corresponding to the positions of electrodes 21 on a circuit board 2 as shown in FIG. 6(a). The metal mask 1 is attached to the circuit board 2 as shown in FIG. 6(b), and tin-lead solder paste 3 is placed on the metal mask 1. Subsequently, a printing squeegee 4 is moved on the metal mask 1 from one end thereof toward the other end, whereby the openings 11 are filled with the tin-lead solder paste 3. The metal mask 1 is then peeled off, whereby a tin-lead solder paste pattern 3a is printed on the circuit board 2 over the electrodes 21 thereon as shown in FIG. 6(c). Electronic parts 5, a lead member 6, etc. are thereafter placed on the solder paste pattern 3a printed on the board 2 as shown in FIG. 6(d), and the board 2 is passed through a reflow furnace for soldering.

Urethane, metal or the like is used as the material for the printing squeegee 4. Because the squeegee of urethane, if used, has the problem that the urethane is scraped off by an edge portion of the metal mask to leave fragments on the board or solder paste pattern, a squeegee of metal is generally used.

It is desired that the circuit boards for use in electronic devices exhibit higher performance, have a multiplicity of functions and be compacted, so that many electronic parts must be mounted on the circuit board using reflow soldering techniques. The above-mentioned tin-lead solder paste has heretofore been used generally for reflow soldering.

However, if electronic devices and circuit boards having parts mounted thereon are discarded in the natural environment after use without being suitably disposed of, there arises the problem that lead, which is toxic heavy metal, will flow out in the form of soluble compounds by being exposed to acid rain, not only adversely affecting the global environment but also exerting influence on animals, plants and human bodies by ingressing into underground water or other water systems. For this reason, it is strongly desireable to use lead-free solders.

Accordingly, tin-silver, tin-silver-copper, tin-bismuth, tin-zinc, tin-antimony and like lead-free solders have been developed, and solder pastes containing such lead-free solders are placed into use. Especially tin-silver and tin-silver-copper solders are usable in place of the tin-lead solder with reliability as high as is conventionally available since silver is stable.

The lead-free solver paste is prepared by mixing a lead-free solder powder consisting mainly of tin with a flux. However, whereas the tin-lead solder has a melting point of about 183° C., the tin-silver or tin-silver-copper lead-free solder has a high melting point of about 220° C., so that if the same flux as the one used in the tin-lead solder is used, the flux vaporizes off before the solder of high melting point melts in the reflow soldering process, and it is impossible to perform satisfactory soldering.

Accordingly, the flux generally in use for the tin-silver or tin-silver-copper lead-free solder paste of high melting point is a composition comprising rosin or modified rosin serving as a base, and a solvent, activator, thixotropic agent and other additives added to the base (see, for example, JP-A No. 2003-10996).

In the case where such a tin-silver, tin-silver-copper or like lead-free solder paste of high melting point is to be printed on circuit boards, the lead-free solder paste is filled into rectangular openings 11 formed in a metal mask 1 as shown in FIG. 3, and a printing squeegee 4 of metal is thereafter moved along the metal mask 1 as shown in FIG. 7(a). If the openings 11 are each so large as to exceed 5 mm.sup2 in area, great frictional heat is liable to occur between the printing metal squeegee 4 and edge portions 15 of the opening 11 in the metal mask 1 shown in FIG. 7(b). Further because the opening 11 is rectangular in shape, the lead-free solder paste filled in is low in fluidity and is liable to be heated to a high temperature, especially at the edge portion 15. However, the flux incorporated in the lead-free solder paste has characteristics to undergo a chemical change and deteriorate (oxidize) when exposed to a high temperature, so that the flux markedly deteriorates (oxidizes) as a result of the frictional heat to result in impaired solder wettability. This seriously lowers the bond strength between a lead member or like large part and the circuit board, entailing the problem that the part becomes removed from the circuit board when subjected, for example, to external pressure or stress.

Furthermore, if the opening 11 of the metal mask 1 has an increased size, it becomes difficult to fill the opening 11 with the solder paste uniformly. Further the reflow soldering process wherein a board 2 having a solder paste pattern 3a printed thereon and carrying parts on the pattern as shown in FIG. 6(d) is passed through a reflow furnace to thereby melt the solder paste and solder the parts onto the board 2 has the problem that the parts are moved and become shifted from the specified positions by virtue of a self-alignment effect produced when the solder paste is melted.

SUMMARY OF THE INVENTION

Accordingly, in view of the foregoing problems, an object of the present invention is to provide a metal mask for performing reflow soldering effectively by diminishing the deterioration of flux due to a chemical change produced by frictional heat even when tin-silver, tin-silver-copper or like lead-free solder paste of high melting point is used, and a method of printing solder paste with use of the metal mask.

The present invention provides a metal mask for use with a circuit board having an electrode formed in a predetermined pattern to join an end portion of a lead member thereto for applying a lead-free solder paste to the electrode of the predetermined pattern. The metal mask is characterized in that the metal mask has two openings formed at a position corresponding to the position of the electrode on the circuit board and arranged in a direction in which the lead member is to extend from the electrode toward other circuit, the two openings being each circular or elliptical in shape.

The invention also provides a lead-free solder paste printing method which is practiced by placing the metal mask of the invention on a circuit board, and moving a printing squeegee along the upper surface of the metal mask to thereby press a lead-free solder paste against the metal mask, force the paste through openings formed in the mask and print the paste on an electrode of predetermined pattern formed on the circuit board.

The lead-free solder paste contains a solder having a melting point higher than 183° C. The circuit board has an electrode to which a lead member is to be joined for electrical connection to other circuit. The method produces on the electrode of the circuit board two lead-free solder paste patterns each circular or elliptical in shape and arranged in a direction in which the lead member is to extend from the electrode toward the other circuit.

When used, the lead-free solder paste printing method of the invention diminishes the frictional heat to be generated between the printing squeegee and the metal mask, gives improved fluidity to the solder paste within the metal mask openings and inhibits the rise in the temperature of the solder paste due to frictional heat. Consequently, parts can be soldered satisfactorily without permitting the deterioration (oxidation) of the flux that would entail an impaired bond strength.

If the metal mask has two openings arranged side by side along a direction orthogonal to the direction in which the lead member is to extend, the solder paste will not be supplied in a sufficient amount to the end portions of the electrode on which a great stress acts from outside when the lead member is joined to the electrode. The arrangement therefore entails the likelihood that an effect to give an improved bond strength will not be available.

DETAILED DESCRIPTION OF EMBODIMENTS

Embodiments of the present invention will be described below with reference to the drawings concerned. The method of printing solder paste with use of a metal mask of the invention is practiced by using a lead-free solder paste which contains a solder having a melting point higher than 183° C., such as a lead-free solder paste containing a tin-silver or tin-silver-copper lead-free solder. Such a lead-free solder paste is usable in place of tin-lead solder with reliability as high as is conventionally available since silver is stable.

Figure 4:
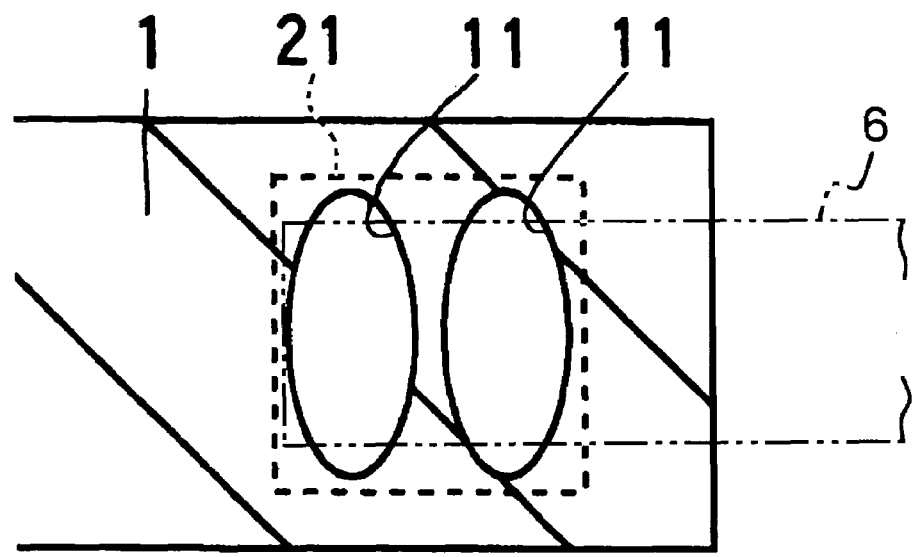
FIG. 4 is a plan view of a metal mask having two elliptical openings for one electrode.

With reference to FIG. 4, a metal mask 1 embodying the invention has two openings 11, 11 at a position corresponding to one electrode 21 which is provided on a circuit board and to which a lead member 6 is to be joined. The two openings 11, 11 are arranged along a direction in which the lead member 6 is to extend from the electrode 21, and are each smaller than conventionally in area and elliptical in shape.

Figure 5:
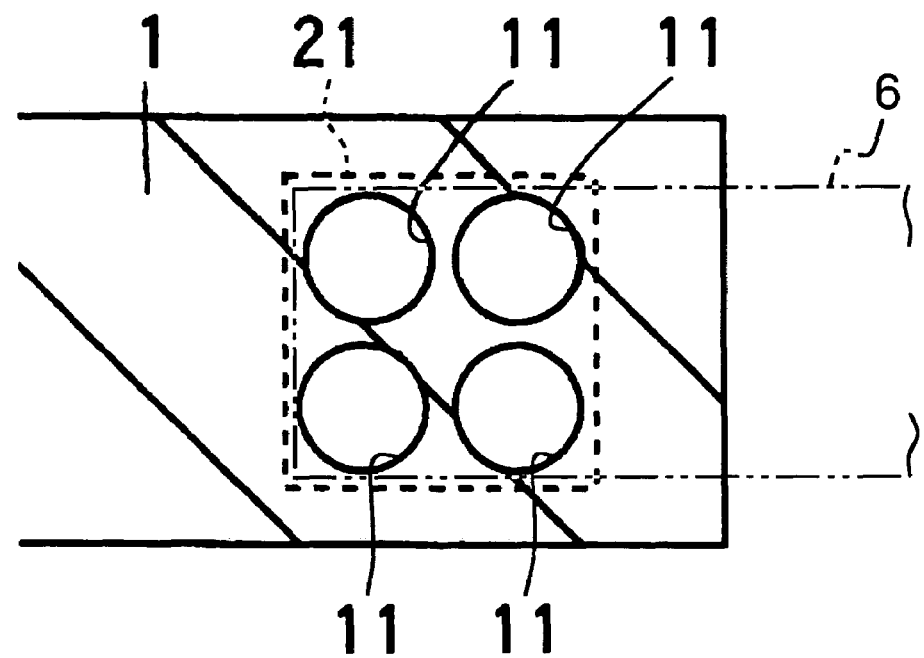
FIG. 5 is a plan view of a metal mask having four circular openings for one electrode.
Figure 6:
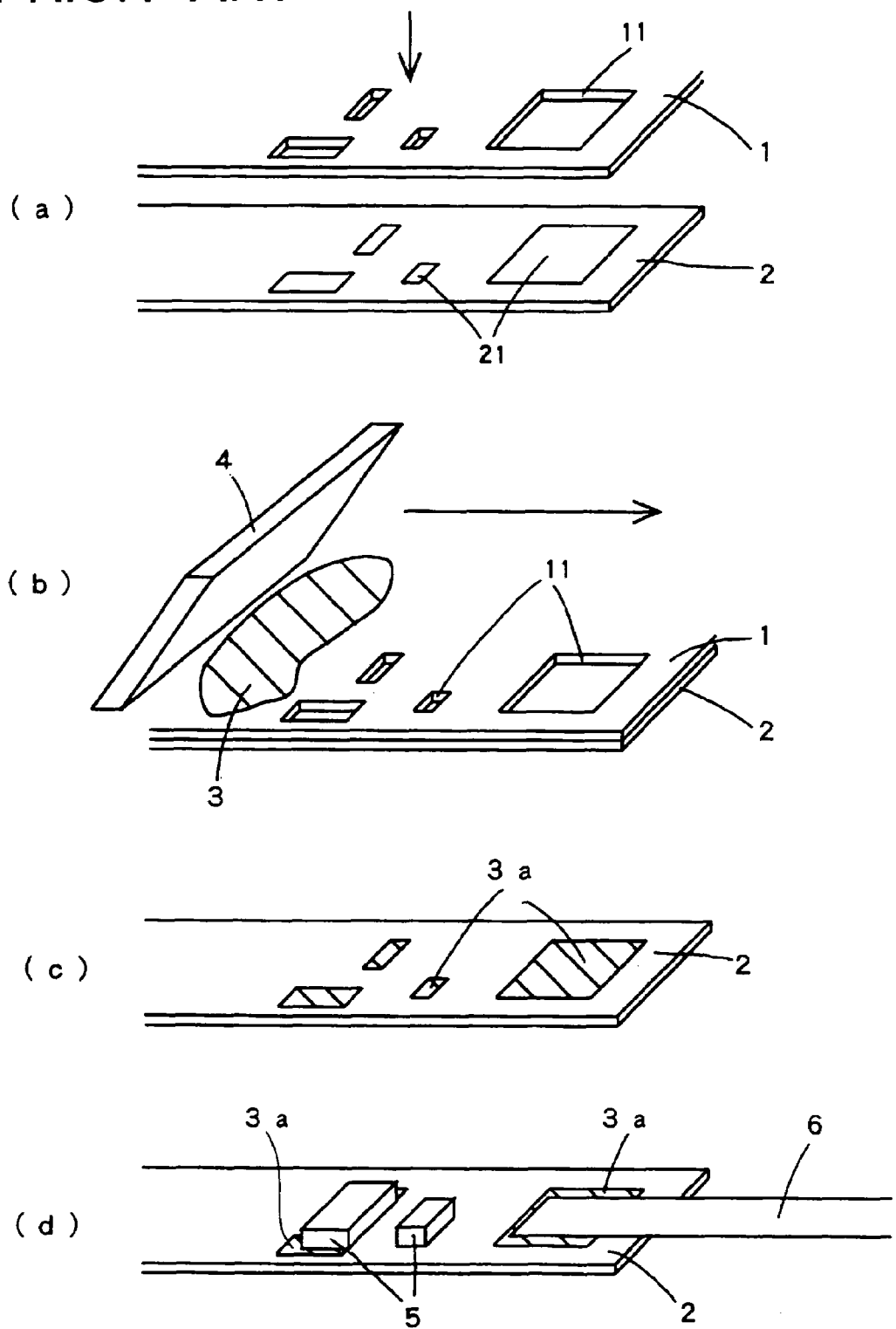
FIG. 6 includes a series of perspective views showing the steps of a conventional method of printing lead-free solder paste.

With reference to FIG. 5, another metal mask 1 according to the invention has four openings 11, 11, 11, 11 at a position corresponding to one electrode 21 which is provided on a circuit board and to which a lead member 6 is to be joined. The four openings 11 are arranged along a direction in which the lead member 6 is to extend from the electrode 21 and along a direction orthogonal to this direction, and are each smaller than conventionally in area and circular in shape.

Figure 1:
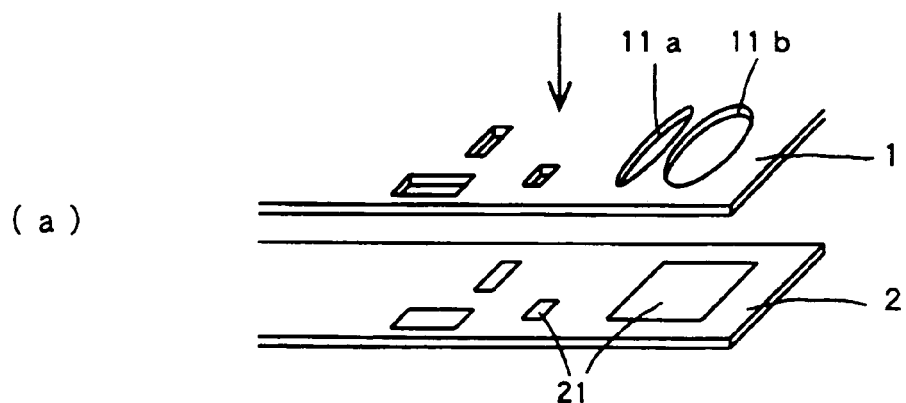
FIG. 1 includes a series of perspective views showing the steps of a method of printing lead-free solder paste according to the invention.
Figure 1:
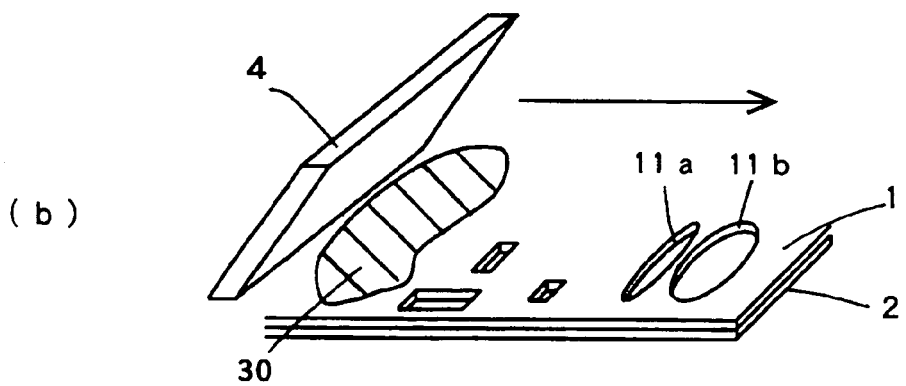
Figure 1:
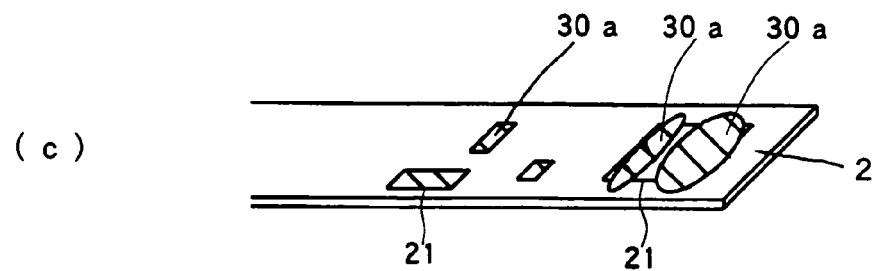
Figure 1:
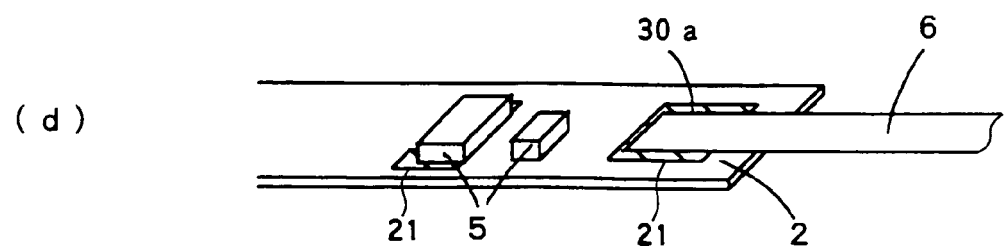
Figure 2:
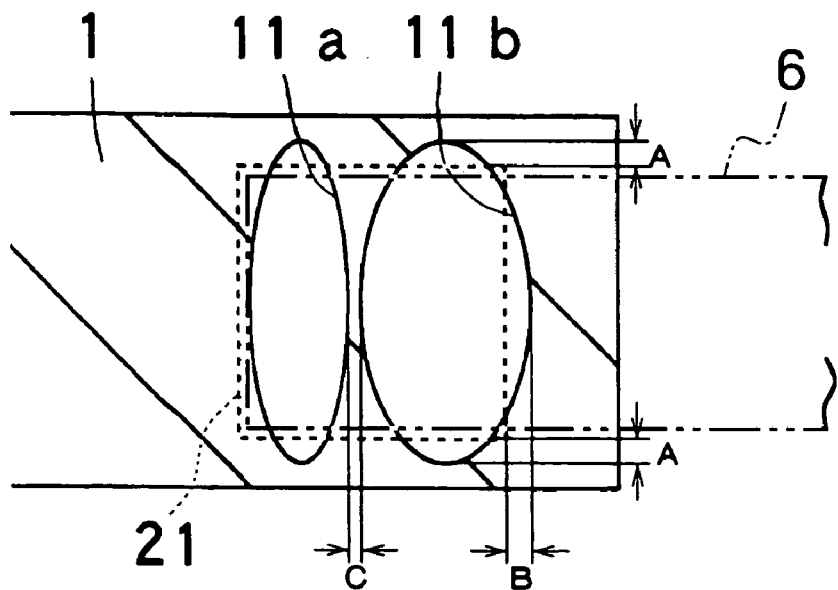
FIG. 2 is a plan view of a metal mask embodying the invention.
Figure 3:
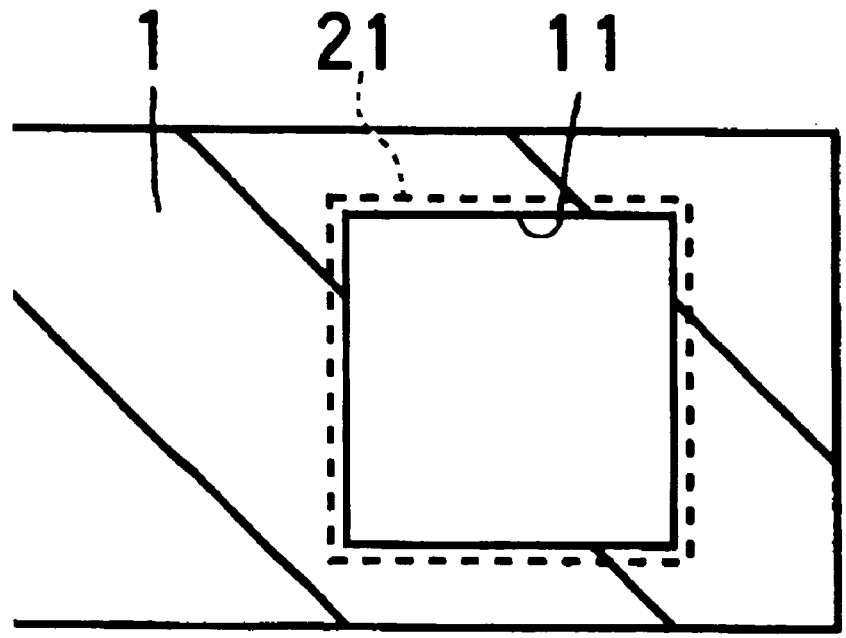
FIG. 3 is a plan view of a conventional metal mask.

FIG. 1 shows the steps of a solder paste printing method of the invention wherein a metal mask 1 shown in FIG. 2 is used. The metal mask 1 has two elliptical openings 11a, 11b corresponding to one electrode 21 which is provided on a circuit board and to which a lead member 6 is to be joined. The openings 11a, 11b are arranged along a direction in which the lead member is to extend from the electrode. The first 11a of these two openings 11a, 11b which is positioned closer to the base end of the lead member 6 is made smaller than the other, i.e., the second, opening 11b in area, and the ratio of the area S1 of the first opening 11a to the area S2 of the second opening 11b, i.e., S1:S2, is set at 1:2.

Furthermore, the two openings 11a, 11b are so sized that opposite ends thereof in directions orthogonal to the direction in which the lead member 6 is to extend bulge out of the electrode 21 on the circuit board toward the respective directions, and the bulging-out dimension A is 0.3 to 0.5 mm. The second opening 11b is further so sized that the end thereof toward the direction in which the lead member 6 is to extend bulges out of the electrode 21 toward the same direction, and the bulging-out dimension B is 0.3 to 0.5 mm. The two openings 11a, 11b are spaced by a distance C of 0.3 to 0.4 mm.

The metal mask 1 described above is prepared first which has two openings 11a, 11b at a position corresponding to the position of an electrode 21 on a circuit board 2 as shown in FIG. 1(a). The metal mask 1 is attached to the circuit board 2 as shown in FIG. 1(b). Next, a tin-silver-copper lead-free solder paste 30 is placed on the metal mask 1, and a printing squeegee 4 is moved on the metal mask 1 from one end thereof toward the other end, whereby the openings 11a, 11b of the metal mask 1 are filled with the lead-free solder paste 30.

The metal mask 1 is thereafter peeled off the circuit board 2. As a result, a lead-free solder paste pattern 30a is printed on the circuit board 2 over the electrode 21 as shown in FIG. 1(c). Electronic parts 5, a lead member 6 in the form of a strip, etc. are then placed on the solder paste pattern 30a over the electrode 21 as seen in FIG. 1(d), and the board 2 is then passed through a reflow furnace for soldering. The solder paste is melted in the furnace, and the solder paste portions as applied beyond the electrode area also become confined to the electrode area.

Figure 7:
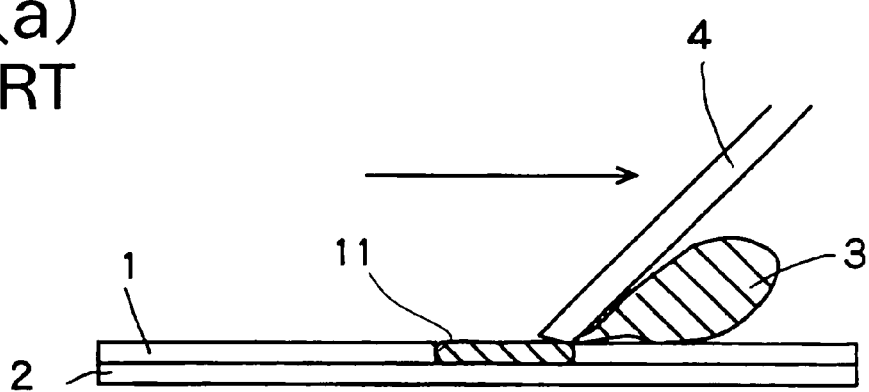
FIG. 7(a) and FIG. 7(b) are a sectional view and a plan view, respectively, for illustrating the generation of friction between a printing squeegee and a metal mask.
Figure 7:
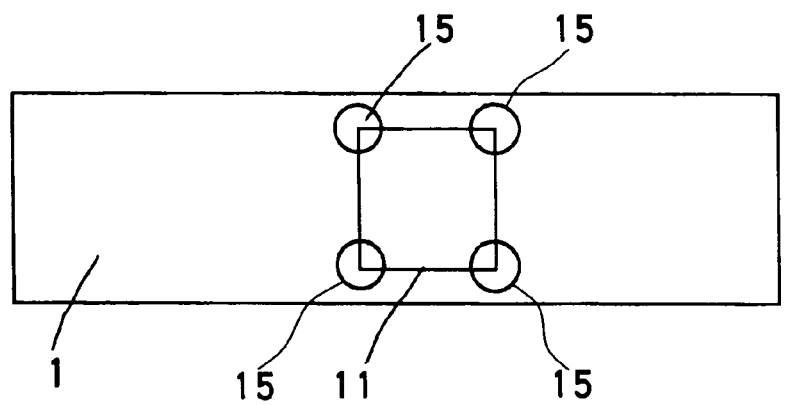

The lead-free solder paste 30 can be uniformly filled into the openings 11a, 11b of the metal mask 1 with ease by the printing method described. The method also diminishes the frictional heat conventionally generated between the printing metal squeegee 4 and the edge portions 15 of the opening 11 of the metal mask 1 shown in FIG. 7(b), further permitting lead-free solder paste 30 to exhibit improved fluidity within the opening to inhibit the rise in the temperature of the solder paste 30.

The second opening 11b of the lead member 6 to be subjected to great external pressure and stress is given a larger area than the first opening 11a positioned toward the base end of the lead member 6 as shown in FIG. 2, and the solder paste pattern is printed excessively beyond the electrode area. Even if the lead member 6 should be shifted owing to a self-alignment effect in the reflow process, this supplies a sufficient amount of solder paste to the electrode at the end portion thereof toward the direction in which the lead member extends and at opposite end portions thereof toward directions orthogonal to this direction, i.e., at the electrode end portions where great pressure and stress are applied from outside when the lead member is joined to the electrode, consequently ensuring a great bond strength. Thus, the lead member 6 can be joined to the circuit board with an increased strength and becomes less likely to be removed from the board.

The area ratio of the first opening 11a to the second opening 11b, i.e., the area ratio of the first print portion provided by the solder paste in the first opening to the second print portion similarly provided by the second opening, is preferably in the range of 1:1.5 to 1:3. If the first print portion is greater than this range in area, the difference between the first print portion and the second print portion in area becomes smaller, failing to afford a sufficient effect to give an improved bond strength against external pressure. Alternatively if the area of the second print portion is greater outside this range, the printing squeegee fails to uniformly apply the lead-free solder paste to the circuit board because of the increased area of the second opening 11b, consequently entailing an impaired bond strength.

According to the lead-free solder paste printing method of the invention, the two openings 11a, 11b in the metal mask 1 are spaced apart by a small distance, so that the solder paste can be transferred effectively for printing, that is, the metal mask is smoothly removable from the resulting print. The metal mask 1 produces two lead-free solder paste patterns 30a, 30a on one electrode 21, with a small clearance formed between the two patterns 30a, 30a, with the result that a gas evolved during soldering is smoothly released through this clearance.

The method of printing a lead-free solder paste with use of the metal mask of the invention diminishes the frictional heat to be generated between the printing squeegee and the metal mask and permits the solder paste to exhibit improved fluidity within the mask openings to inhibit the rise in the temperature of the solder paste due to the frictional heat even when the solder paste used is a tin-silver or tin-silver-copper lead-free solder paste of high melting point. Consequently parts can be soldered satisfactorily without permitting deterioration (oxidation) of the flux that would entail an impaired bond strength.

Figure 8:
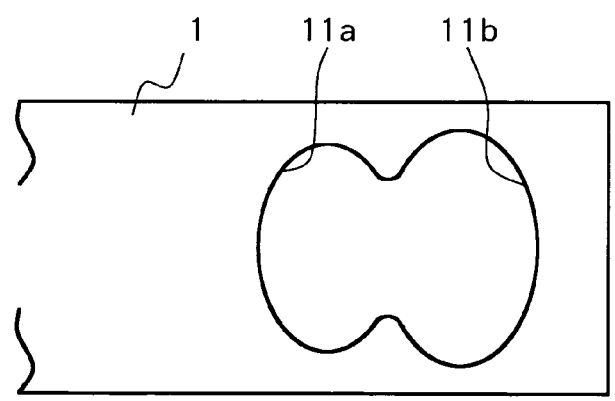
FIG. 8 is a plan view showing a metal mask having two openings which are joined to each other.

The metal mask and method of the invention are not limited to the foregoing embodiments but can be modified variously by one skilled in the art without departing from the spirit of the invention. For example, when the two openings 11a, 11b formed in the metal mask 1 are in communication with each other at their side portions as shown in FIG. 8, the same advantage as described above is available. The openings in the metal mask of the invention are not limited to the circular or elliptical shape but can be of other shapes which are equivalent to the circular or elliptical shape and which produce an effect equivalent to that available by the circular or elliptical opening.

What is claimed is:

1. A lead-free solder paste printing method comprising placing a metal mask (1) on a circuit board (2) having an electrode (21) formed in a predetermined pattern to join an end portion of a lead member (6), and moving a printing squeegee (4) along an upper surface of the metal mask (1) to thereby print a lead-free solder paste (30) on a surface of the electrode (21) on the circuit board (2), wherein the metal mask (1) has two openings (11a, 11b) having centers on a line extending parallel to the longitudinal length of the lead member (6) and formed within a region corresponding to the electrode (21) on the circuit board (2) to join the end portion of the lead member (6), each having an elliptical non-circular shape, wherein the first (11a) of the two openings (11a, 11b) which is positioned closer to said end portion of the lead member (6) is smaller than the other second opening (11b) in area, and two lead-free solder paste patterns (30a, 30a) are printed on the electrode (21) by using the metal mask (1), the two solder paste patterns being arranged longitudinally of the lead member (6).

2. A lead-free solder paste printing method according to claim 1 wherein the first (11a) of the two openings (11a, 11b) of the metal mask (1) which is positioned closer to said end portion of the lead member (6) to be joined to the electrode (21) on the circuit board (2) is smaller than the other second opening (11b) in area.

3. A lead-free solder paste printing method comprising placing a metal mask (1) on a circuit board (2) having an electrode (21) formed in a predetermined pattern to join an end portion of a lead member (6), and moving a printing squeegee (4) along an upper surface of the metal mask (1) to thereby print a lead-free solder paste (30) on a surface of the electrode (21) on the circuit board (2), wherein the metal mask (1) has two openings (11a, 11b) formed at a position corresponding to the position of the electrode (21) on the circuit board (2) and each having an elliptical shape, and two lead-free solder paste patterns (30a, 30a) are printed on the electrode (21) by using the metal mask (1), the two solder paste patterns being arranged in a direction in which the lead member (6) is to extend from the electrode (21) toward another circuit, wherein the first (11a) of the two openings (11a, 11b) of the metal mask (1) which is positioned closer to said end portion of the lead member (6) to be joined to the electrode (21) on the circuit board (2) is smaller than the other second opening (11b) in area, and wherein the area ratio of the first opening (11a) of the metal mask (1) to the second opening (11b) thereof is 1:1.5 to 1:3.

4. A lead-free solder paste printing method according to claim 1 wherein the two openings (11a, 11b) of the metal mask (1) are so sized that opposite ends thereof in directions orthogonal to said direction in which the lead member (6) is to extend bulge out of the electrode (21) on the circuit board (2) toward the respective directions.

5. A lead-free solder paste printing method according to claim 4 wherein the opening (11b) of the two openings (11a, 11b) of the metal mask (1) which opening is positioned toward said direction in which the lead member is to extend is so sized that an end thereof toward said direction in which the lead member is to extend bulges out of the electrode (21) on the circuit board (2) toward said same direction.

6. A lead-free solder paste printing method according to claim 1 wherein the lead-free solder paste (30) comprises a solder consisting mainly of tin and containing silver, or a solder consisting mainly of tin and containing silver and copper.

7. A lead-free solder paste printing method according to claim 1, wherein each of the openings (11a, 11b) has a minor axis in a direction in which the lead member (6) is to extend from the electrode.

* * * * *